United States Patent
Ramesh et al.

(10) Patent No.: US 11,164,625 B2
(45) Date of Patent: Nov. 2, 2021

(54) EXTENDED MEMORY COMMUNICATION

(71) Applicant: Micron Technology, Inc., Boise, ID (US)

(72) Inventors: Vijay S. Ramesh, Boise, ID (US); Allan Porterfield, Durham, NC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/109,999

(22) Filed: Dec. 2, 2020

(65) Prior Publication Data

US 2021/0225443 A1 Jul. 22, 2021

Related U.S. Application Data

(63) Continuation of application No. 16/744,541, filed on Jan. 16, 2020, now Pat. No. 10,910,048.

(51) Int. Cl.
| | |
|---|---|
| *G11C 11/24* | (2006.01) |
| *G11C 13/00* | (2006.01) |
| *G06F 9/54* | (2006.01) |
| *G06F 7/57* | (2006.01) |
| *G06F 9/30* | (2018.01) |

(52) U.S. Cl.
CPC .......... *G11C 13/0023* (2013.01); *G06F 7/57* (2013.01); *G06F 9/3001* (2013.01); *G06F 9/542* (2013.01); *G06F 9/546* (2013.01); *G11C 13/004* (2013.01); *G11C 13/0069* (2013.01); *G11C 2213/71* (2013.01)

(58) Field of Classification Search
CPC .......... G11C 13/0069; G11C 13/0004; G11C 13/0007; G11C 2213/79; G11C 2213/72
USPC ............................................ 365/149, 189.14
See application file for complete search history.

(56) References Cited

U.S. PATENT DOCUMENTS

| | | | |
|---|---|---|---|
| 8,438,455 B2 | 5/2013 | Vogan et al. | |
| 9,449,035 B2 | 9/2016 | Grossman et al. | |
| 9,477,295 B2 | 10/2016 | Jreji et al. | |
| 9,484,103 B1 | 11/2016 | Bruce et al. | |
| 10,910,048 B1 * | 2/2021 | Ramesh | G11C 13/004 |
| 2010/0017649 A1 | 1/2010 | Wu et al. | |

(Continued)

OTHER PUBLICATIONS

International Search Report and Written Opinion from related PCT Application No. PCT/US2020/064831, dated Apr. 1, 2021, 10 pages.

*Primary Examiner* — Son T Dinh
(74) *Attorney, Agent, or Firm* — Brooks, Cameron & Huebsch, PLLC

(57) ABSTRACT

Systems, apparatuses, and methods related to extended memory communication subsystems for performing extended memory operations are described. An example method can include receiving, at a processing unit that is coupled between a host device and a non-volatile memory device, signaling indicative of a plurality of operations to be performed on data written to or read from the non-volatile memory device. The method can further include performing, at the processing unit, at least one operation of the plurality of operations in response to the signaling. The method can further include accessing a portion of a memory array in the non-volatile memory device. The method can further include transmitting additional signaling indicative of a command to perform one or more additional operations of the plurality of operations on the data written to or read from the non-volatile memory device.

19 Claims, 6 Drawing Sheets

(56) References Cited

U.S. PATENT DOCUMENTS

2015/0371684 A1   12/2015  Mataya
2018/0293129 A1   10/2018  Aberl et al.
2019/0347034 A1*  11/2019  Hasbun ................ G06F 3/0688
2020/0004671 A1    1/2020  Neufeld et al.

* cited by examiner

EXTENDED MEMORY COMMUNICATION

PRIORITY INFORMATION

This application is a continuation of U.S. application Ser. No. 16/744,541, filed Jan. 16, 2020, the contents of which are incorporated herein by reference.

TECHNICAL FIELD

The present disclosure relates generally to semiconductor memory and methods, and more particularly, to apparatuses, systems, and methods for an extended memory communication.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
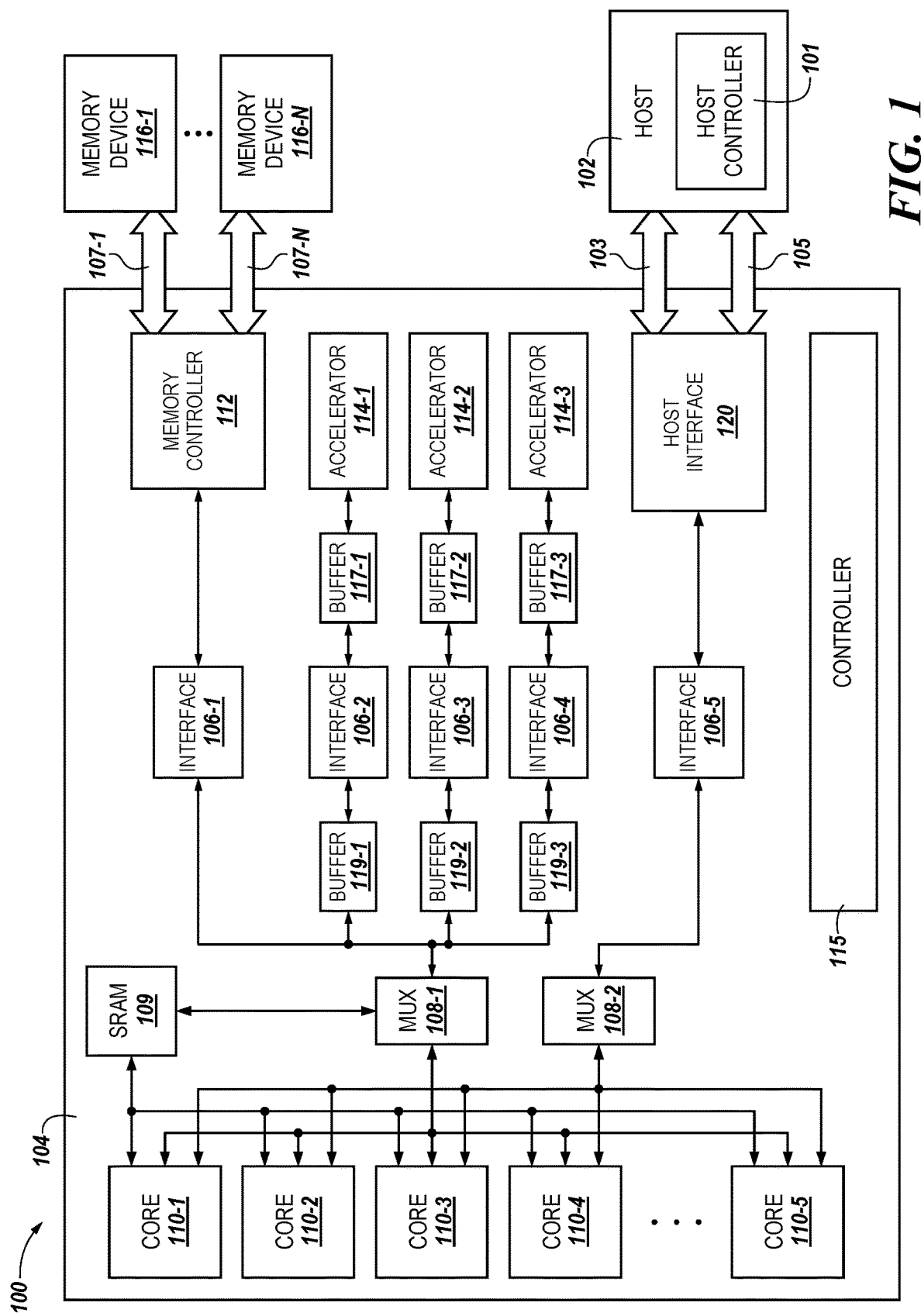
FIG. 1 is a functional block diagram in the form of a computing system including an apparatus including a first plurality of communication subsystems, a second plurality of communication subsystems, and a plurality of memory devices in accordance with a number of embodiments of the present disclosure.

Systems, apparatuses, and methods related to extended memory communication subsystems for performing extended memory operations are described. An example method can include receiving, at a processing unit that is coupled between a host device and a non-volatile memory device, signaling indicative of a plurality of operations to be performed on data written to or read from the non-volatile memory device. The method can further include performing, at the processing unit, at least one operation of the plurality of operations in response to the signaling. The method can further include accessing a portion of a memory array in the non-volatile memory device. The method can further include transmitting additional signaling indicative of a command to perform one or more additional operations of the plurality of operations on the data written to or read from the non-volatile memory device.

Extended memory communication can include providing signals and/or commands across extended memory. An extended memory interface can transfer instructions to perform operations specified by a single address and operand and may be performed by the computing device that includes a processing unit and a memory resource. The computing device can perform extended memory operations on data streamed through the computing device without receipt of intervening commands. The extended memory operations can include an operation in which data is ordered, reordered, removed, or discarded, a comma-separated value parsing operation, or both. In an example, a computing device is configured to receive a command to perform an operation that comprises performing an operation on data with the processing unit of the computing device and determine that an operand corresponding to the operation is stored in the memory resource. The computing device can further perform the operation using the operand stored in the memory resource.

The computing device can perform hardware acceleration by sending instructions and/or commands to a number of hardware accelerators to perform the operation. In some examples, a portion of the operation can be sent to a first hardware accelerator and a second portion of the operation can be sent to a second hardware accelerator. In some examples, the operation can be sent to a hardware accelerator for completion and the hardware accelerator can send a portion of the operation to an additional hardware accelerator to complete a portion of the operation. In this way, results from more than one hardware accelerator can be sent to the computing device to combine the results or a primary hardware accelerator can combine the results and send the completed result to the computing device.

Hardware acceleration can be implemented in computing systems to perform certain tasks and/or functions in a manner that is more efficient (e.g., faster, more accurate, higher quality, etc.) in comparison to performing the task and/or function using a central processing unit (CPU) of the computing system. For example, by providing dedicated hardware (e.g., a hardware accelerator or hardware acceleration unit) that is configured to perform a certain task and/or function that can otherwise be performed using the CPU of the computing system, certain tasks and/or functions can be processed in a more efficient manner than in approaches in which the CPU is responsible for performance of such tasks and/or functions. This can further allow for processing resources that could otherwise be consumed by the CPU to be freed up, thereby further improving performance of the computing system.

Some examples of hardware accelerators include sounds processing units (e.g., sound cards), graphics processing units (GPUs or "graphics cards"), digital signal processing units, analog signal processing units, computer networking processing units (e.g., networks on a chip, TCP offload engines, I/O acceleration processing units, etc.), cryptography processing units (e.g., cryptographic accelerator units, which can provide hardware-based encryption and/or decryption), artificial intelligence processing units (e.g., vision processing units, neural network processing units, etc.), tensor processing units, physics processing units, regular expression processing units, and/or data compression acceleration units, among others. Hardware accelerators can be provided as computer hardware in the form of a field-programmable gate array (FPGA), an application-specific integrated circuit (ASIC), and/or a complex programmable logic device, a system-on-chip, among others. It will be appreciated that the foregoing enumerated examples of hardware accelerators and specifically enumerated examples of computer hardware are neither limiting nor exhaustive, and other hardware accelerators and/or computer hardware are contemplated within the scope of the disclosure.

In some approaches, hardware accelerators can be deployed in a computing system as discrete components that perform a specified task and/or function with no visibility to other hardware accelerators that can be deployed within the computing system. For example, in some approaches, a hardware accelerator can operate without knowledge of other hardware accelerators deployed within the computing system. Further, in some approaches, hardware accelerators can be dedicated to perform a limited set of specific tasks and/or functions. For example, a sound processing unit can be provided in a computing system with the sole purpose of performing hardware acceleration on signals related to auditory playback for the computing system. As another example, a GPU can be provided in a computing system for the sole purpose of performing hardware acceleration on signals related to visual display for the computing system.

As is described below, the computing device can be a RISC-V application processor core, capable of supporting full-featured operating systems such as Linux. This particular core can be used in association with applications such as internet-of-things (IoT) nodes and gateways, storage, and/or networking. The core can be coupled to a number of ports, such as a memory port, a system port, a peripheral port, and/or a front port. As an example, the memory port can be in communication with a memory device, the system port can be in communication with an on-chip accelerator, the peripheral port can be in communication with an off-chip serial port, and/or the front port can be in communication with a host interface, as will be described further below in association with FIG. 4.

In this way, the first communication subsystems can be used to direct data from a particular port (e.g., a memory port of a computing device) through a first communication subsystem (e.g., a multiplexer that selects that particular memory port) and transfer it through a second communication subsystem (e.g., an interface such as an AXI interconnect interface) to a memory controller that transfer the data to a memory device (e.g., a DDR memory, a three-dimensional (3-D) cross-point memory, a NAND memory, etc.). In an example, the AXI interconnect interfaces can conform to the AMBA® AXI version 4 specifications from ARM®, including the AXI4-Lite control register interface subset.

As used herein, an "extended memory operation" refers to a memory operation that can be specified by a single address (e.g., a memory address) and an operand, such as a 64-bit operand. An operand can be represented as a plurality of bits (e.g., a bit string or string of bits). Embodiments are not limited to operations specified by a 64-bit operand, however, and the operation can be specified by an operand that is larger (e.g., 128-bits, etc.) or smaller (e.g., 32-bits) than 64-bits. As described herein, the effective address space accessible with which to perform extended memory operations is the size of a memory device or file system accessible to a host computing system or storage controller.

Figure 5:
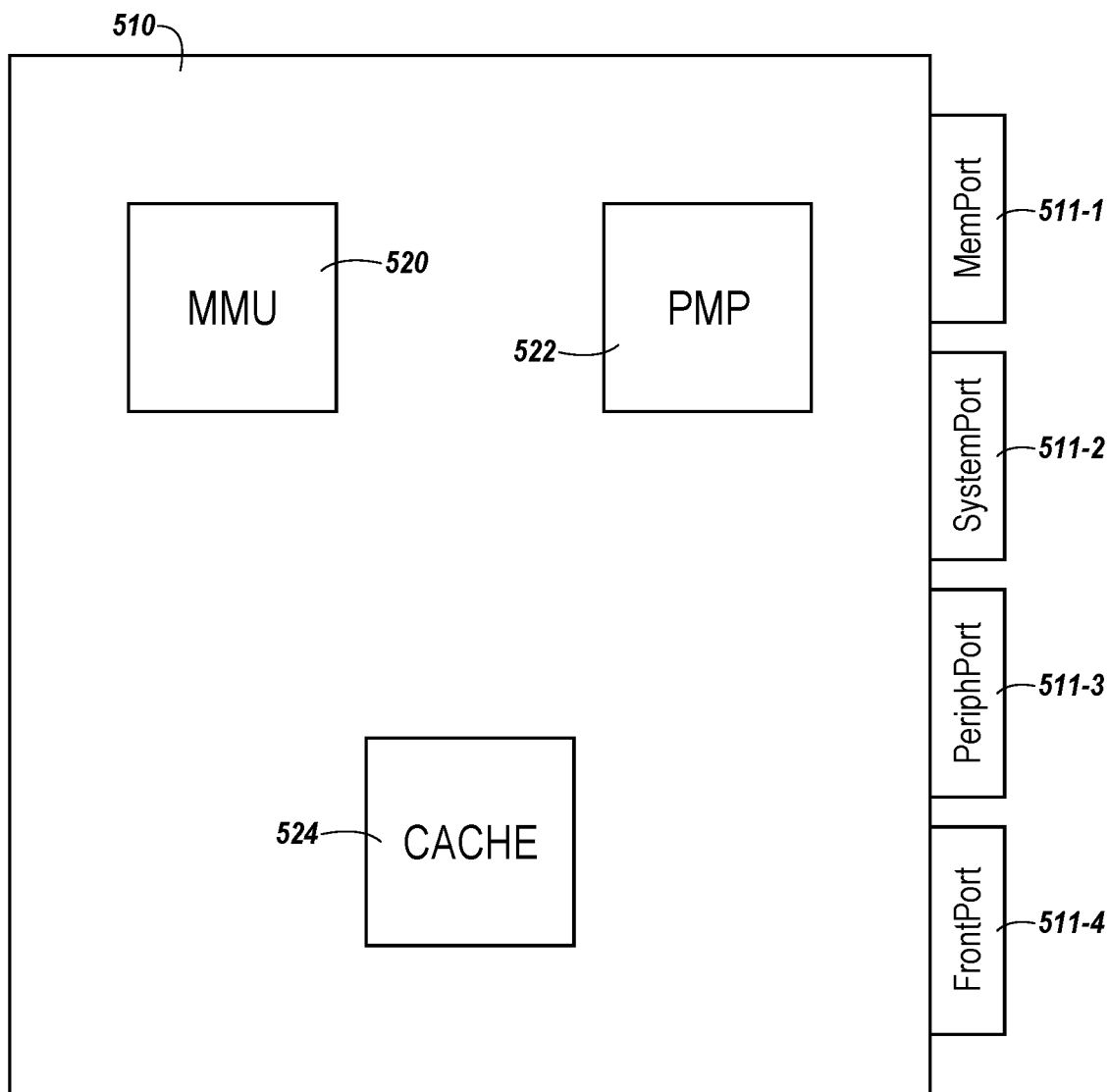
FIG. 5 is a functional block diagram in the form of an apparatus of a computing core including a number of ports in accordance with a number of embodiments of the present disclosure.

Extended memory operations can include instructions and/or operations that can be performed by a processing device (e.g., by a processing device such as a core 110, 210, 310, 410, or a core computing device specifically shown as 510 in FIG. 5). Examples of a core can include a reduced instruction set computing device or other hardware processing device that can execute instructions to perform various computing tasks. In some embodiments, performing an extended memory operation can include retrieving data and/or instructions stored in a memory resource of the computing device, performing the operation within the computing device 110 (e.g., without transferring the data or instructions to circuitry external to the computing device), and storing the result of the extended memory operation in the memory resource of the computing device 110 or in secondary storage (e.g., in a memory device such as the memory device 116-1, 116-2, illustrated in FIG. 1, herein). Signaling indicative of a plurality of operations to be performed on data written to or from a memory device can be sent to or from the computing devices 110, accelerators 114, etc.

Non-limiting examples of extended memory operations can include floating point add accumulate, 32-bit complex operations, square root address (SQRT(addr)) operations, conversion operations (e.g., converting between floating-point and integer formats, and/or converting between floating-point and universal number formats such as Type I, Type II, and/or Type III universal number formats, posit formats, etc.), normalizing data to a fixed format, absolute value operations, etc. In some embodiments, extended memory operations can include operations performed by the computing device that update in place (e.g., in which a result of an extended memory operation is stored at the address in which an operand used in performance of the extended memory operation is stored prior to performance of the extended memory operation), as well as operations in which previously stored data is used to determine a new data (e.g., operations in which an operand stored at a particular address is used to generate new data that overwrites the particular address where the operand was stored).

As a result, in some embodiments, performance of extended memory operations can mitigate or eliminate locking or mutex operations, because the extended memory operation(s) can be performed within the computing device, which can reduce contention between multiple thread execution. Reducing or eliminating performance of locking or mutex operations on threads during performance of the extended memory operations can lead to increased performance of a computing system, for example, because extended memory operations can be performed in parallel within a same computing device or across two or more of the computing devices that are in communication with each other. In addition, in some embodiments, extended memory operations described herein can mitigate or eliminate locking or mutex operations when a result of the extended memory operation is transferred from the computing device that performed the operation to a host.

Memory devices may be used to store important or critical data in a computing device and can transfer, via at least one extended memory interface, such data between a host associated with the computing device. However, as the size and quantity of data stored by memory devices increases, transferring the data to and from the host can become time consuming and resource intensive. For example, when a host requests performance of memory operations using large blocks of data, an amount of time and/or an amount of resources consumed in obliging the request can increase in proportion to the size and/or quantity of data associated with the blocks of data.

As storage capability of memory devices increases, these effects can become more pronounced as more and more data are able to be stored by the memory device and are therefore available for use in memory operations. In addition, because data may be processed (e.g., memory operations may be performed on the data), as the amount of data that is able to be stored in memory devices increases, the amount of data that may be processed can also increase. This can lead to increased processing time and/or increased processing resource consumption, which can be compounded in performance of certain types of memory operations. In order to alleviate these and other issues, embodiments herein can allow for extended memory operations to be performed using a memory device, one or more computing devices, and/or memory array(s) and a first plurality of communication subsystems (e.g., multiplexers) and a second plurality of subsystems (e.g., interfaces such as AXI interconnects) in order to transfer data more efficiently from a computing device to a memory device and/or from a computing device to a host, and vice versa.

In some approaches, performing memory operations can require multiple clock cycles and/or multiple function calls to memory of a computing system such as a memory device and/or memory array. In contrast, embodiments herein can allow for performance of extended memory operations in which a memory operation is performed with a single function call or command. For example, in contrast to approaches in which at least one command and/or function call is utilized to load data to be operated upon and then at least one subsequent function call or command to store the data that has been operated upon is utilized, embodiments herein can allow for performance of memory operations using fewer function calls or commands in comparison to other approaches. Further, the computing devices of the computing system can receive requests to perform the memory operations via a first communication subsystem (e.g., a multiplexer, a control network-on-chip, etc.) and/or a second communication subsystem (e.g., an interface, an interconnect such as an AXI interconnect, etc.) and can receive blocks of data for executing the requested memory operations from the memory device via the first communication subsystem and the second communication subsystem. While the first and the second communication subsystem are described in tandem, embodiments are not so limited. As an example, the requests for data and/or receipt of blocks of data can be via the second communication subsystem alone.

By reducing the number of function calls and/or commands utilized in performance of memory operations, an amount of time consumed in performing such operations and/or an amount of computing resources consumed in performance of such operations can be reduced in comparison to approaches in which multiple function calls and/or commands are required for performance of memory operations. Further, embodiments herein can reduce movement of data within a memory device and/or memory array because data may not need to be loaded into a specific location prior to performance of memory operations. This can reduce processing time in comparison to some approaches, especially in scenarios in which a large amount of data is subject to a memory operation.

Further, extended memory operations described herein can allow for a much larger set of type fields in comparison to some approaches. For example, an instruction executed by a host to request performance of an operation using data in a memory device (e.g., a memory sub-system) can include a type, an address, and a data field. The instruction can be sent to at least one of a plurality of computing devices via a first communication subsystem (e.g., a multiplexer) and a second communication subsystem (e.g., an interface) and the data can be transferred from the memory device via the first and/or second communication subsystem. The type field can correspond to the particular operation being requested, the address can correspond to an address in which data to be used in performance of the operation is stored, and the data field can correspond to the data (e.g., an operand) to be used in performing the operation. In some approaches, type fields can be limited to different size reads and/or writes, as well as some simple integer accumulate operations. In contrast, embodiments herein can allow for a broader spectrum of type fields to be utilized because the effective address space that can be used when performing extended memory operations can correspond to a size of the memory device. By extending the address space available to perform operations, embodiments herein can therefore allow for a broader range of type fields and, therefore, a broader spectrum of memory operations can be performed than in approaches that do not allow for an effective address space that is the size of the memory device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X," "Y," "N," "M," "A," "B," "C," "D," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 104 may reference element "04" in FIG. 1, and a similar element may be referenced as 204 in FIG. 2. A group or plurality of similar elements or components may generally be referred to herein with a single element number. For example, a plurality of reference elements 110-1, 110-2, 110-3, 110-4, 110-5 may be referred to generally as 110. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus 104 including a plurality of computing devices 110, a first plurality of communication subsystems 108, a second plurality of communication subsystems 106, a plurality of hardware accelerators 114, and a plurality of memory devices 116, in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, memory devices 116-1 . . . 116-N can include one or more memory modules (e.g., double data rate (DDR) memory, three-dimensional (3D) cross-point memory, NAND memory, single in-line memory modules, dual in-line memory modules, etc.). The memory devices 116-1, . . . , 116-N can include volatile memory and/or non-volatile memory. In a number of embodiments, memory devices 116-1, . . . , 116-N can include a multi-chip device. A multi-chip device can include a number of different memory types and/or memory modules. For example, a memory system can include non-volatile or volatile memory on any type of a module.

The memory devices 116-1, . . . , 116-N can provide main memory for the computing system 100 or could be used as additional memory or storage throughout the computing system 100. Each memory device 116-1, . . . , 116-N can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

In embodiments in which the memory devices 116-1, . . . , 116-N include non-volatile memory, the memory devices 116-1, . . . , 116-N can be flash memory devices such as NAND or NOR flash memory devices. Embodiments are not so limited, however, and the memory devices 116-1, . . . , 116-N can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

As illustrated in FIG. 1, the plurality of computing devices 110-1, 110-2, 110-3, 110-4, 110-5 (hereinafter referred to collectively as plurality of computing devices 110) can be coupled to an SRAM 109. The plurality of computing devices 110 can be coupled to the SRAM 109 through a bus matrix. Further, the plurality of computing devices 110 can be coupled to the first plurality of communication subsystems (e.g., multiplexers) 108-1, 108-2. The first plurality of communication subsystems 108 can include circuitry and/or logic configured to allocate and de-allocate resources to the computing devices 110 during performance of operations described herein. For example, the circuitry and/or logic can allocate and/or de-allocate resources to the computing devices 110 during performance of extended memory operations described herein.

The plurality of computing devices 110 can be coupled to a first (108-1) of the first plurality of communication subsystems 108 through the SRAM 109. The plurality of computing devices 110 can be directly coupled to the first of the first plurality of communication subsystems 1081-1 and/or to a second (108-2) of the first plurality of communication subsystems 108, as illustrated by arrows in FIG. 1. In this way, each of the first plurality of communication subsystems can select a particular computing device 110 for transferring data, and vice versa, each of the computing devices 110 can transfer data through the first plurality of communication subsystems 108.

The first plurality of communication subsystems 108-1 can be coupled to a second plurality of communication subsystems (e.g., interfaces such as an interconnect interface) 106-1, 106-2, 106-3, 106-4, 106-5 (hereinafter referred to collectively as second plurality of communication subsystems 106). Each of the second plurality of communication subsystems 106 can be coupled to a corresponding one of a controller 112, an accelerator 114, and a host interface 120. In one example, the second plurality of communication subsystems 106 can be coupled to the corresponding controller 112, accelerators 114, and/or host interface 120 via a number of AXI buses.

As is illustrated, a first (106-1) of the second plurality of communication subsystems 106 can be coupled to the controller (e.g., memory controller) 112. The controller 112 can be coupled to a number of memory devices 116-1, . . . , 116-N via a number of channels 107-1, . . . , 107-N. A second (106-2), third (106-3), and fourth (106-4) of the second plurality of communication subsystems 106 can each be coupled to a corresponding one of the plurality of hardware accelerators 114-1, 114-2, 114-3. The communication subsystem 108-1 can be coupled to the second plurality of communication subsystems 106-2, 106-3, 106-4 via respective buffers 119-1, 119-2, 119-3. The second plurality of communication subsystems 106-2, 106-3, 106-4 can be coupled to the plurality of hardware accelerators 114 via respective buffers 117-1, 117-2, 117-3. The hardware accelerators 114 can be used for performing a number of posit operations, and/or for communication with an internal SRAM on the FPGA.

A posit operation can refer to an operation performed using universal number ("unum") formatted bit strings as operands and/or as inputs. As used herein, universal number formatted bit strings can provide an alternative to the IEEE floating point bit string standard. Several universal number formats exist (e.g., Type I universal numbers, Type II universal numbers, and Type III universal numbers). The Type III unum format is referred to herein as a "posit format" or, for simplicity, a "posit." In contrast to floating-point bit strings, posits can, under certain conditions, allow for higher precision (e.g., a broader dynamic range, higher resolution, and/or higher accuracy) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations thereby reducing processing time and/or power consumed in performing such operations. In addition, the use of posits in computing systems can allow for higher accuracy and/or precision in computations than floating-point numbers, which can further improve the functioning of a computing system in comparison to some approaches (e.g., approaches which rely upon floating-point format bit strings).

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

A computing device 110 can send a command to perform a posit operation and/or additional operations. The computing device 100 can divide the posit operation into portions of sub-operations to each be sent to a hardware accelerator 114. For example, a first computing device 110-1 can divide a posit operation into two sub-operations and a first of the two sub-operations can be sent to a first hardware accelerator 114-1 and a second of the two sub-operations can be sent to a second hardware accelerator 114-2. The results of the first and the second sub-operation can be sent to the first computing device 110-1 and the first computing device 110-1 can combine the results into a single result of the posit operation.

In one example, a computing device 110 can send a posit operation to a first hardware accelerator 114-1 and the first hardware accelerator 114-1 can send a portion of the posit operation to a second hardware accelerator 114-2. Upon receipt of the result of the portion of the posit operation from the second hardware accelerator 114-2, the first hardware accelerator 114-1 can generate a result for the posit operation, including the result from the portion of the posit operation. Likewise, any number of divisions of a posit operation can be sent from a computing device 110 to particular numbers of corresponding hardware accelerators 114 to perform the posit operation and the results can be combined for a final result of the posit operation. Likewise, multiple computing devices 110 can sub-divide a posit operation and send different portions to different hardware accelerators 114 to perform the sub-divided posit operations. As an example, a posit operation can be sub-divided by computing devices 110 and the sub-divided posit operations can be further sub-divided by each corresponding computing device 110 and sent to different hardware accelerators 114.

Further, another additional one (also not illustrated) of the second plurality of communication subsystems 106 can be used for transferring data off-chip through an off-chip serial port. The fifth (106-5) of the second plurality of communication subsystems 106 can be coupled to a host interface 120 and can communicate, via channels 103/105, with a host controller 101 of a host 102. While not illustrated, a communication subsystem (such as another of the second plurality of communication subsystems, not illustrated) can be coupled to logic circuitry. The logic circuitry can be on a same field programmable gate array (FPGA) as the computing devices 110, first plurality of communication subsystems, second plurality of communication subsystems 106, etc.

In one embodiment, the computing device 110 can process an operation queue of messages from a host 102. The operation queue can be processed by the computing device 110 by reading an input message with arguments and executing a desired function. Further, the computing device 110 can read and/or write data to at least one of the memory devices 116-1, . . . , 116-N in order to perform an operation. The computing device 110 can generate a work item message to be performed and generate a message to send to at least one of the hardware accelerators 114 indicating to perform a work item associated with the input message. The message can identify an operation or sub-operation to be performed in relation to the receipted input message and arguments, identify a hardware accelerator to be activated and a function to be performed, identify an input data location of the memory device 116, and identify an output data location of the memory device 116. As an example, the input data location can indicate a location of data in the memory device 116 to retrieve data from in order to perform the work item. The output data location can indicate a location in the memory device 116 to store the resultant output of the operation of the work item. The work item message can be sent to the corresponding hardware accelerator 114 queue (e.g., such as to the buffer 117 of a respective hardware accelerator 114). As the results of the operation are generated or received, additional messages indicating additional operations to be performed can be generated and sent to hardware accelerators. The generation of messages and reception of results can continue until a final result of the initial operation brings the work item to completion. Upon completion of the work item, a completion message can be sent to the computing device 110 indicating the work item has been complete. A message can be sent to the host 102 indicating that the work item has been completed.

The hardware accelerator 114, upon receipt of a work item, can read the work item message, including corresponding data locations in the memory device 116. The hardware accelerator 114 can perform the requested accelerator operations contained within the message. In one embodiment, the hardware accelerator 114 can send a portion of the operation to an additional hardware accelerator 114 (e.g., hardware accelerator 114-1 can receive the message and can send a portion of the operation in the message to hardware accelerator 114-2 to be completed by hardware accelerator 114-2). The completed portion of the operation (executed by hardware accelerator 114-2) can be sent to the initial hardware accelerator (114-1) and the initial hardware accelerator (114-1) can combine the completed portion with other results to finalized completion of the operation in the work item message. Once fully complete, the hardware accelerator 114 can send a message to the computing device 110 indicating the work item has been completed.

In one embodiment, the host 102 can send a request for a computing device 110 to perform an operation. The computing device 110 can perform data initialization and write the data to location in the memory device 116. As the computing device 110 generates 4K (or a multiple thereof) of data, the computing device 110 can creates a work item to be completed by a hardware accelerator 114. To further process the data. When the hardware accelerator 114 completes the work item, the hardware accelerator can send a message to the computing device 110 that the work item is complete. The computing device 110 can either further process the data, send the data to another hardware accelerator 114, or leave the data in the memory device 116 alone and continue processing the data further.

The host 102 can map the data into its own address space. The host 102 can map a file (e.g., Linux for example) into the computing device 110 processing unit address space. The computing device 110 has a map between its addresses and the locations within the memory device 116. When a hardware accelerator 116 work item is created, the address passed to the hardware accelerator 114 can be the logical block address of the memory device 116. The host 102 can be responsible for mapping the address between the file system and the 64-bit address space of the computing device 110. The computing device 110 can be responsible for mapping its addresses into logical block locations of the memory device 116. In this way, the hardware accelerators 114 are responsible for transferring data from one logical data location of the memory device 116 to another.

The host 102 can be a host system such as a personal laptop computer, a desktop computer, a digital camera, a smart phone, a memory card reader, and/or internet-of-things enabled device, among various other types of hosts, and can include a memory access device, e.g., a processor (or processing device). One of ordinary skill in the art will appreciate that "a processor" can intend one or more processors, such as a parallel processing system, a number of coprocessors, etc. The host 102 can include a system motherboard and/or backplane and can include a number of processing resources (e.g., one or more processors, microprocessors, or some other type of controlling circuitry). In some embodiments, the host can include the host controller 101, which can be configured to control at least some operations of the host 102 by, for example, generating and transferring commands to the host controller to cause performance of operations such as extended memory operations. The host controller 101 can include circuitry (e.g., hardware) that can be configured to control at least some operations of the host 102. For example, the host controller 101 can be an application specific integrated circuit (ASIC), a field programmable gate array (FPGA), or other combination of circuitry and/or logic configured to control at least some operations of the host 102.

The system 100 can include separate integrated circuits or the host 102, the first plurality of communication subsystems 108, the second plurality of communication subsystems 106, the controller 112, the on-chip accelerators 114, the host interface 120, and/or the memory devices 116-1, . . . , 116-N can be on the same integrated circuit. The system 100 can be, for instance, a server system and/or a high performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

The controller 112 can be configured to request a block of data from one or more of the memory devices 116-1, . . . , 116-N and cause the cores 110-1, . . . , 110-N, which may be referred to in the alternative as "computing devices," herein, to perform an operation (e.g., an extended memory operation) on the block of data. The operation may be performed to evaluate a function that can be specified by a single address and one or more operands associated with the block of data. The controller 112 can be further configured to cause a result of the extended memory operation to be stored in one or more of the computing devices 110-1, . . . , 110-N through the second 106 and/or the first 108 communication subsystems and/or to be transferred to a channel (e.g., communication paths 103 and/or 105) and/or the host 102.

In some embodiments, the second plurality of communication subsystems 106 can request a remote command, start a DMA command, send a read/write location, and/or send a start function execution command to one of the plurality of computing devices 110. In some embodiments, the second plurality of communication subsystems 106 can request that a block of data be copied from a buffer of a computing device 110 to a buffer of a memory controller 112 or memory device 116. Vice versa, one of the second plurality of communication subsystems 106 can request that a block of data be copied to the buffer of the computing device 110 from the buffer of the memory controller 112 or memory device 116. The second plurality of communication subsystems 106 can request that a block of data be copied to a computing device 110 from a buffer of the host 102 or, vice versa, request that a block of data be copied from a computing device 110 to a host 102. The second plurality of communication subsystems 106 can request that a block of data be copied to a buffer of the host 102 from a buffer of the memory controller 112 or memory device 116. Vice versa, the second plurality of communication subsystems 106 can request that a block of data be copied from a buffer of the host 102 to a buffer of the memory controller 112 or memory device 116. Further, in some embodiments, the second plurality of communication subsystems 106 can request that a command from a host be executed on a computing device 110. The second plurality of communication subsystems 106 can request that a command from a computing device 110 be executed on an additional computing device 110. The second plurality of communication subsystems 106 can request that a command from a memory controller 112 be executed on a computing device 110. In some embodiments, as described in more detail in connection with FIG. 3, herein, the second plurality of communication subsystems 106 can include at least a portion of a controller (not illustrated).

In some embodiments, the second plurality of communication subsystems 106 can transfer a block of data (e.g., a direct memory access (DMA) block of data) from a computing device 110 to a media device 116 (via the memory controller 112) or, vice versa, can transfer a block of data to a computing device 110 from a media device 116. The second plurality of communication subsystems 106 transfer a block of data (e.g., a DMA block) from a computing device 110 to a host 102 or, vice versa, to a computing device 110 from a host 102. Further, the second plurality of communication subsystems 106 can transfer a block of data (e.g., a DMA block) from a host 102 to a media device 116 or, vice versa, to a host 102 from a media device 116. In some embodiments, the second plurality of communication subsystems 106 can receive an output (e.g., data on which an extended memory operation has been performed) from the computing devices 110-1, ..., 110-N and transfer the output from the computing devices 110-1, ..., 110-N to a controller 115 of the apparatus 104 and/or the host 102, and vice versa. For example, the second plurality of communication subsystems 106 may be configured to receive data that has been subjected to an extended memory operation by the computing devices 110-1, ..., 110-N and transfer the data that corresponds to the result of the extended memory operation to a controller 115 and/or the host 102. In some embodiments, second plurality of communication subsystems 106 can include at least a portion of the controller 115. For example, the second plurality of communication subsystems 106 can include the circuitry that comprises the controller 115, or a portion thereof.

The memory controller 112 can be a "standard" or "dumb" memory controller. For example, the memory controller 112 can be configured to perform simple operations such as copy, write, read, error correct, etc. for the memory devices 116-1, ..., 116-N. However, in some embodiments, the memory controller 112 does not perform processing (e.g., operations to manipulate data) on data associated with the memory devices 116-1, ..., 116-N. For example, the memory controller 112 can cause a read and/or write operation to be performed to read or write data from or to the memory devices 116-1, ..., 116-N via the communication paths 107-1, ..., 107-N, but the memory controller 112 may not perform processing on the data read from or written to the memory devices 116-1, ..., 116-N. In some embodiments, the memory controller 112 can be a non-volatile memory controller, although embodiments are not so limited.

The embodiment of FIG. 1 can include additional circuitry that is not illustrated so as not to obscure embodiments of the present disclosure. For example, the apparatus 104 can include address circuitry to latch address signals provided over I/O connections through I/O circuitry. Address signals can be received and decoded by a row decoder and a column decoder to access the memory devices 116-1, ..., 116-N. It will be appreciated by those skilled in the art that the number of address input connections can depend on the density and architecture of the memory devices 116-1, ..., 116-N.

In some embodiments, extended memory operations can be performed using the computing system 100 shown in FIG. 1 by selectively storing or mapping data (e.g., a file) into a computing device 110. The data can be selectively stored in an address space of the computing memory. In some embodiments, the data can be selectively stored or mapped in the computing device 110 in response to a command received from the host 102. In embodiments in which the command is received from the host 102, the command can be transferred to the computing device 110 via an interface (e.g., communication paths 103 and/or 105) associated with the host 102 and via the first and second plurality of communication subsystems 108 and 106, respectively. The interface(s) 103/105, first plurality of communication subsystems 108 and the second plurality of communication subsystems 106 can be peripheral component interconnect express (PCIe) buses, double data rate (DDR) interfaces, interconnect interfaces (such as AXI interconnect interfaces), multiplexers (muxes), or other suitable interfaces or buses. Embodiments are not so limited, however.

In a non-limiting example in which the data (e.g., in which data to be used in performance of an extended memory operation) is mapped into the computing device 110, the host controller 101 can transfer a command to the computing device 110 to initiate performance of an extended memory operation using the data mapped into the computing device 110. In some embodiments, the host controller 101 can look up an address (e.g., a physical address) corresponding to the data mapped into the computing device 110 and determine, based on the address, which computing device (e.g., the computing device 110-1) the address (and hence, the data) is mapped to. The command can then be transferred to the computing device (e.g., the computing device 110-1) that contains the address (and hence, the data).

In some embodiments, the data can be a 64-bit operand, although embodiments are not limited to operands having a specific size or length. In an embodiment in which the data is a 64-bit operand, once the host controller 101 transfers the command to initiate performance of the extended memory operation to the correct computing device (e.g., the computing device 110-1) based on the address at which the data is stored, the computing device (e.g., the computing device 110-1) can perform the extended memory operation using the data.

In some embodiments, the computing devices 110 can be separately addressable across a contiguous address space, which can facilitate performance of extended memory operations as described herein. That is, an address at which data is stored, or to which data is mapped, can be unique for all the computing devices 110 such that when the host controller 101 looks up the address, the address corresponds to a location in a particular computing device (e.g., the computing device 110-1).

For example, a first computing device 110-1 can have a first set of addresses associated therewith, a second computing device 110-2 can have a second set of addresses associated therewith, a third computing device 110-3 can have a third set of addresses associated therewith, through the n-th computing device (e.g., the computing device 110-N), which can have an n-th set of addresses associated therewith. That is, the first computing device 110-1 can have a set of addresses 0000000 to 0999999, the second computing device 110-2 can have a set of addresses 1000000 to 1999999, the third computing device 110-3 can have a set of addresses 2000000 to 2999999, etc. It will be appreciated that these address numbers are merely illustrative, non-limiting, and can be dependent on the architecture and/or size (e.g., storage capacity) of the computing devices 110.

As a non-limiting example in which the extended memory operation comprises a floating-point-add-accumulate operation (FLOATINGPOINT_ADD_ACCUMULATE), the computing devices 110 can treat the destination address as a floating-point number, add the floating-point number to the argument stored at the address of the computing device 110, and store the result back in the original address. For example, when the host controller 101 (or an apparatus controller 115, not shown) initiates performance of a floating-point add accumulate extended memory operation, the address of the computing device 110 that the host looks up (e.g., the address in the computing device to which the data is mapped) can be treated as a floating-point number and the data stored in the address can be treated as an operand for performance of the extended memory operation. Responsive to receipt of the command to initiate the extended memory operation, the computing device 110 to which the data (e.g., the operand in this example) is mapped can perform an addition operation to add the data to the address (e.g., the numerical value of the address) and store the result of the addition back in the original address of the computing device 110.

As described above, performance of such extended memory operations can, in some embodiments require only a single command (e.g., request command) to be transferred from the host 102 (e.g., from the host controller 101) to the memory device 104 or from the controller 115 to the computing device(s) 110. In contrast to some previous approaches, this can reduce an amount of time, for example, for multiple commands to traverse the interface(s) 103, 105 and/or for data, such as operands to be moved from one address to another within the computing device(s) 110, consumed in performance of operations.

In addition, performance of extended memory operations in accordance with the disclosure can further reduce an amount of processing power or processing time since the data mapped into the computing device 110 in which the extended memory operation is performed can be utilized as an operand for the extended memory operation and/or the address to which the data is mapped can be used as an operand for the extended memory operation, in contrast to approaches in which the operands must be retrieved and loaded from different locations prior to performance of operations. That is, at least because embodiments herein allow for loading of the operand to be skipped, performance of the computing system 100 may be improved in comparison to approaches that load the operands and subsequently store a result of an operations performed between the operands.

Further, in some embodiments, because the extended memory operation can be performed within a computing device 110 using the address and the data stored in the address and, in some embodiments, because the result of the extended memory operation can be stored back in the original address, locking or mutex operations may be relaxed or not required during performance of the extended memory operation. Reducing or eliminating performance of locking or mutex operations on threads during performance of the extended memory operations can lead to increased performance of the computing system 100 because extended memory operations can be performed in parallel within a same computing device 110 or across two or more of the computing devices 110.

In some embodiments, valid mappings of data in the computing devices 110 can include a base address, a segment size, and/or a length. The base address can correspond to an address in the computing device 110 in which the data mapping is stored. The segment size can correspond to an amount of data (e.g., in bytes) that the computing system 100 can process, and the length can correspond to a quantity of bits corresponding to the data. It is noted that, in some embodiments, the data stored in the computing device(s) 110 can be uncacheable on the host 102. For example, the extended memory operations can be performed entirely within the computing devices 110 without encumbering or otherwise transferring the data to or from the host 102 during performance of the extended memory operations.

In a non-limiting example in which the base address is 4096, the segment size is 1024, and the length is 16,386, a mapped address, 7234, may be in a third segment, which can correspond to a third computing device (e.g., the computing device 110-3) among the plurality of computing devices 110.

In this example, the host 102 and/or the first 108 and second 106 communication subsystems can forward a command (e.g., a request) to perform an extended memory operation to the third computing device 110-3. The third computing device 110-3 can determine if data is stored in the mapped address in a memory of the third computing device 110-3. If data is stored in the mapped address (e.g., the address in the third computing device 110-3), the third computing device 110-3 can perform a requested extended memory operation using that data and can store a result of the extended memory operation back into the address in which the data was originally stored.

In some embodiments, the computing device 110 that contains the data that is requested for performance of an extended memory operation can be determined by the host controller 101, and/or the first 108 and/or second 106 communication subsystems. For example, a portion of a total address space available to all the computing devices 110 can be allocated to each respective computing device. Accordingly, the host controller 101 and/or the first 108 and/or second 106 communication subsystems can be provided with information corresponding to which portions of the total address space correspond to which computing devices 110 and can therefore direct the relevant computing devices 110 to perform extended memory operations. In some embodiments, the host controller 101 and/or the second 106 communication subsystems can store addresses (or address ranges) that correspond to the respective computing devices 110 in a data structure, such as a table, and direct performance of the extended memory operations to the computing devices 110 based on the addresses stored in the data structure.

Embodiments are not so limited, however, and in some embodiments, the host controller 101 and/or the second communication subsystems 106 can determine a size (e.g., an amount of data) of the memory resource(s) and, based on the size of the memory resource(s) associated with each computing device 110 and the total address space available to all the computing devices 110, determine which computing device 110 stores data to be used in performance of an extended memory operation. In embodiments in which the host controller 101 and/or the second communication subsystems 106 determine the computing device 110 that stores the data to be used in performance of an extended memory operation based on the total address space available to all the computing devices 110 and the amount of memory resource(s) available to each computing device 110, it can be possible to perform extended memory operations across multiple non-overlapping portions of the computing device memory resource(s).

Continuing with the above example, if there is not data in the requested address, the third computing device 110-3 can request the data as described in more detail in connection with FIGS. 2-5, herein, and perform the extended memory operation once the data is loaded into the address of the third computing device 110-3. In some embodiments, once the extended memory operation is completed by the computing device (e.g., the third computing device 110-3 in this example), and/or the host 102 can be notified and/or a result of the extended memory operation can be transferred to the memory devices 116 and/or the host 102.

In some embodiments, the memory controller 112 can be configured to retrieve blocks of data from a memory device(s) 116-1, ..., 116-N coupled to the apparatus 104 in response to a request from a controller of the apparatus 104 or a host 102. The memory controller 112 can subsequently cause the blocks of data to be transferred to the computing devices 110-1, ..., 110-N and/or the apparatus controller. Similarly, the memory controller 112 can be configured to receive blocks of data from the computing devices 110 and/or the controller 115. The memory controller 112 can subsequently cause the blocks of data to be transferred to a memory device 116 coupled to the storage controller 104.

The blocks of data can be approximately 4 kilobytes in size (although embodiments are not limited to this particular size) and can be processed in a streaming manner by the computing devices 110-1, ..., 110-N in response to one or more commands generated by the controller 115 and/or a host and sent via the second communication subsystems 106. In some embodiments, the blocks of data can be 32-bit, 64-bit, 128-bit, etc. words or chunks of data, and/or the blocks of data can correspond to operands to be used in performance of an extended memory operation.

For example, as described in more detail in connection with FIGS. 2-5, herein, because the computing devices 110 can perform an extended memory operation (e.g., process) a second block of data in response to completion of performance of an extended memory operation on a preceding block of data, the blocks of data can be continuously streamed through the computing devices 110 while the blocks of data are being processed by the computing devices 110. In some embodiments, the blocks of data can be processed in a streaming fashion through the computing devices 110 in the absence of an intervening command from the controller and/or the host 102. That is, in some embodiments, the controller 115 (or host 102) can issue a command to cause the computing devices 110 to process blocks of data received thereto and blocks of data that are subsequently received by the computing devices 110 can be processed in the absence of an additional command from the controller.

In some embodiments, processing the blocks of data can include performing an extended memory operation using the blocks of data. For example, the computing devices 110-1, ..., 110-N can, in response to commands from the controller via the second plurality of communication subsystems 106, perform extended memory operations the blocks of data to evaluate one or more functions, remove unwanted data, extract relevant data, or otherwise use the blocks of data in connection with performance of an extended memory operation.

In a non-limiting example in which the data (e.g., in which data to be used in performance of an extended memory operation) is mapped into one or more of the computing devices 110, the controller can transfer a command to the computing device 110 to initiate performance of an extended memory operation using the data mapped into the computing device(s) 110. In some embodiments, the controller 115 can look up an address (e.g., a physical address) corresponding to the data mapped into the computing device(s) 110 and determine, based on the address, which computing device (e.g., the computing device 110-1) the address (and hence, the data) is mapped to. The command can then be transferred to the computing device (e.g., the computing device 110-1) that contains the address (and hence, the data). In some embodiments, the command can be transferred to the computing device (e.g., the computing device 110-1) via the second communication subsystem 106.

The controller 115 (or a host) can be further configured to send commands to the computing devices 110 to allocate and/or de-allocate resources available to the computing devices 110 for use in performing extended memory operations using the blocks of data. In some embodiments, allocating and/or de-allocating resources available to the computing devices 110 can include selectively enabling some of the computing devices 110 while selectively disabling some of the computing devices 110. For example, if less than a total number of computing devices 110 are required to process the blocks of data, the controller 115 can send a command to the computing devices 110 that are to be used for processing the blocks of data to enable only those computing devices 110 desired to process the blocks of data.

The controller 115 can, in some embodiments, be further configured to send commands to synchronize performance of operations, such as extended memory operations, performed by the computing devices 110. For example, the controller 115 (and/or a host) can send a command to a first computing device 110-1 to cause the first computing device 110-1 to perform a first extended memory operation, and the controller 115 (or the host) can send a command to a second computing device 110-2 to perform a second extended memory operation using the second computing device. Synchronization of performance of operations, such as extended memory operations, performed by the computing devices 110 by the controller 115 can further include causing the computing devices 110 to perform particular operations at particular time or in a particular order.

As described above, data that results from performance of an extended memory operation can be stored in the original address in the computing device 110 in which the data was stored prior to performance of the extended memory operation, however, in some embodiments, blocks of data that result from performance of the extended memory operation can be converted into logical records subsequent to performance of the extended memory operation. The logical records can comprise data records that are independent of their physical locations. For example, the logical records may be data records that point to an address (e.g., a location) in at least one of the computing devices 110 where physical data corresponding to performance of the extended memory operation is stored.

In some embodiments, the result of the extended memory operation can be stored in an address of a computing device memory that is the same as the address in which the data is stored prior to performance of the extended memory operation. Embodiments are not so limited, however, and the result of the extended memory operation can be stored in an address of the computing device memory that is the same as the address in which the data is stored prior to performance of the extended memory operation. In some embodiments, the logical records can point to these address locations such that the result(s) of the extended memory operation can be accessed from the computing devices 110 and transferred to circuitry external to the computing devices 110 (e.g., to a host).

In some embodiments, the controller 115 can receive and/or send blocks of data directly to and from the memory controller 112. This can allow the controller 115 to transfer blocks of data that are not processed (e.g., blocks of data that are not used in performance of extended memory operations) by the computing devices 110 to and from the memory controller 112.

For example, if the controller 115 receives unprocessed blocks of data from a host 102 coupled to the storage controller 104 that are to be stored by memory device(s) 116 coupled to the storage controller 104, the controller 115 can cause the unprocessed blocks of data to be transferred to the memory controller 112, which can, in turn, cause the unprocessed blocks of data to be transferred to memory device(s) coupled to the storage controller 104.

Similarly, if the host requests an unprocessed (e.g., a full) block of data (e.g., a block of data that is not processed by the computing devices 110), the memory controller 112 can cause unprocessed blocks of data to be transferred to the controller 115, which can subsequently transfer the unprocessed blocks of data to the host.

Figure 2:
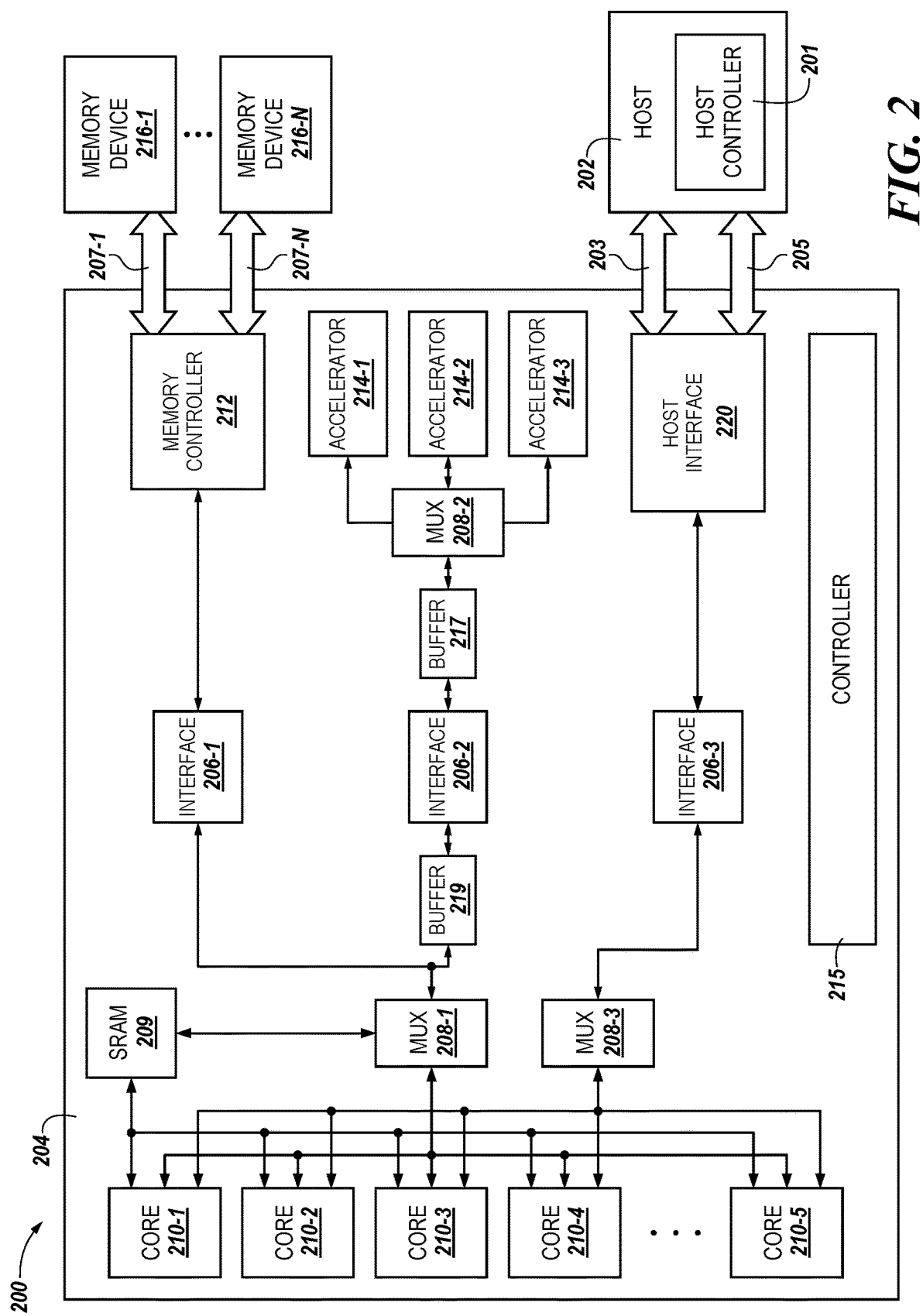
FIG. 2 is yet another functional block diagram in the form of a computing system including an apparatus including a first plurality of communication subsystems, a second plurality of communication subsystems, and a plurality of memory devices in accordance with a number of embodiments of the present disclosure.

FIG. 2 is a functional block diagram in the form of a computing system 200 including an apparatus 204 including a first plurality of communication subsystems 208, a second plurality of communication subsystems 206, and a plurality of memory devices 216 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 2, memory devices 216-1 . . . 216-N can include one or more memory modules (e.g., double data rate (DDR) memory, three-dimensional (3D) cross-point memory, NAND memory, single in-line memory modules, dual in-line memory modules, etc.). The memory devices 216-1, . . . , 216-N can include volatile memory and/or non-volatile memory. In a number of embodiments, memory devices 216-1, . . . , 216-N can include a multi-chip device. A multi-chip device can include a number of different memory types and/or memory modules. For example, a memory system can include non-volatile or volatile memory on any type of a module.

As illustrated in FIG. 2, and in contrast to FIG. 1, a plurality of computing devices 210-1, 210-2, 210-3, 210-4, 210-5 (hereinafter referred to collectively as plurality of computing devices 210) can be coupled to a first 208-1 of the first plurality of communication subsystem 208, which is coupled to the plurality of hardware accelerators 114 through a second 206-2 of the second plurality of communication subsystems 206. In one embodiment, the first plurality of communication subsystems 208 can be a plurality of multiplexers and the second plurality of communication subsystems 206 can be a plurality of AXI interconnects. Further, the first communication subsystem 208-1 is coupled directly to a buffer 219 which is coupled to the second communication subsystem 206-2. The second 206-2 of the second plurality of communication subsystems 206 is coupled directly to an additional buffer 217. The additional buffer 217 is coupled to a second 208-2 of the first plurality of communication subsystems 208. The second 208-2 of the first plurality of communication subsystems 208 can be coupled to each of the plurality of hardware accelerators 214-1, 214-2, 214-3. The hardware accelerators 214 can be on a same field programmable gate array (FPGA) as the computing devices 210, first plurality of communication subsystems 208, second plurality of communication subsystems 206, etc. The hardware accelerators 214 can be used for performing a number of posit operations, and/or for communication with an internal SRAM on the FPGA.

The first plurality of communication subsystems 208 can include circuitry and/or logic configured to allocate and de-allocate resources to the computing devices 210 during performance of operations described herein. For example, the circuitry and/or logic can allocate and/or de-allocate resources to the computing devices 210 during performance of extended memory operations described herein. While the examples described above include a particular number of multiplexers within a particular arrangement, examples are not so limited. For example, a multiplexer can be positioned between the buffer 219 and the second communication subsystem 206-2, between the second communication subsystem 206-2 and the buffer 208-3, etc. A third 208-3 of the first plurality of communication subsystems 208 can be coupled to a third of the second plurality of communication subsystems 206-3. The third communication subsystem 206-3 can be coupled to a host interface 220. In one example, the third communication subsystem 206-3 can be coupled to the host interface 220 via a number of AXI buses.

As is illustrated, a first (206-1) of the second plurality of communication subsystems 206 can be coupled to the controller (e.g., memory controller) 212). The controller 212 can be coupled to a number of memory devices 216-1, . . . , 216-N via a number of channels 207-1, . . . , 207-N.

Figure 3:
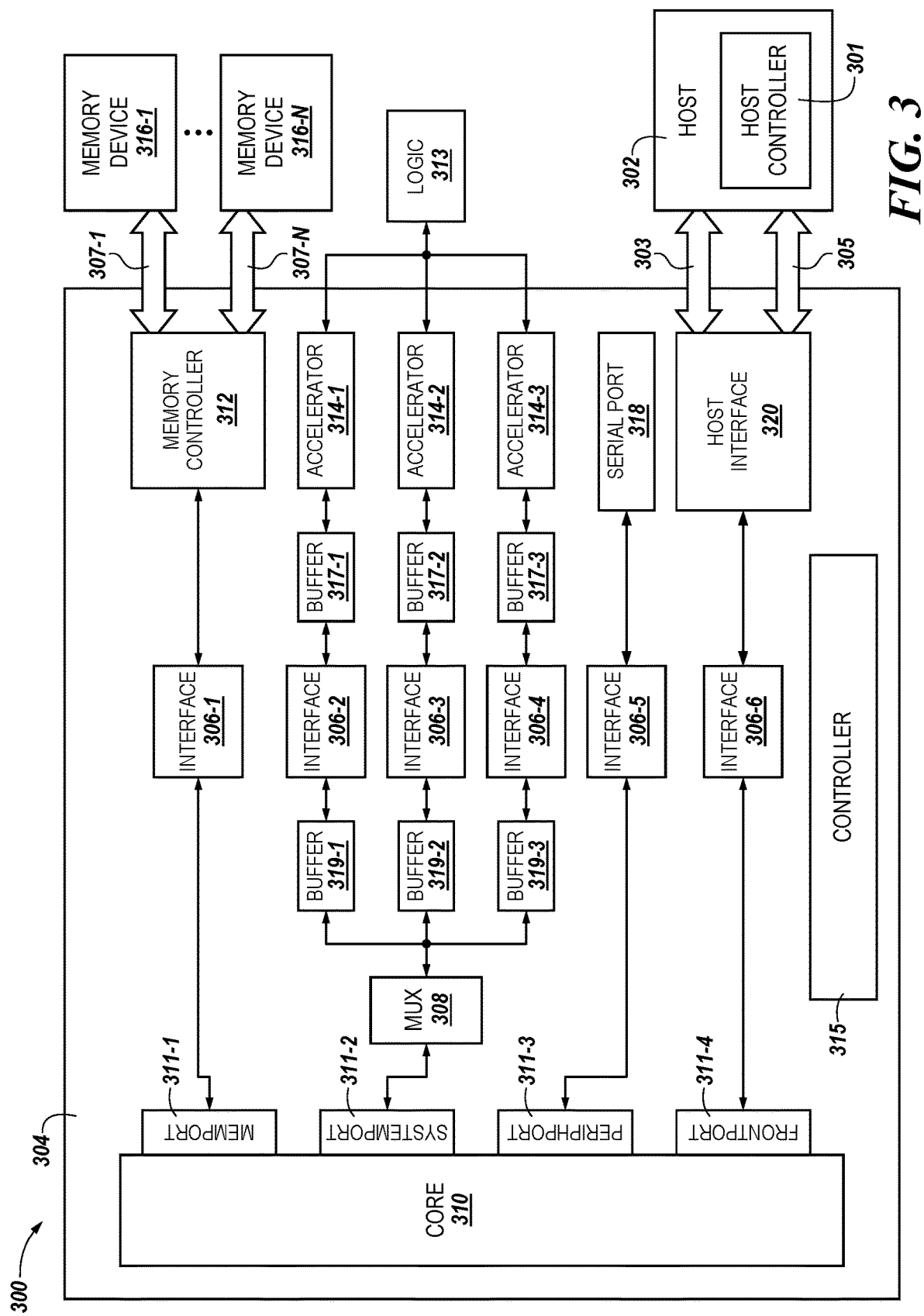
FIG. 3 is yet another functional block diagram in the form of a computing system including an apparatus including a first plurality of communication subsystems, a second plurality of communication subsystems, and a plurality of memory devices in accordance with a number of embodiments of the present disclosure.

FIG. 3 is a functional block diagram in the form of a computing system 300 including an apparatus 304 including a plurality of communication subsystems 306, 308 and a plurality of memory devices 316 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 3, memory devices 316-1 . . . 316-N can include one or more memory modules (e.g., double data rate (DDR) memory, three-dimensional (3D) cross-point memory, NAND memory, single in-line memory modules, dual in-line memory modules, etc.). The memory devices 316-1, . . . , 316-N can include volatile memory and/or non-volatile memory. In a number of embodiments, memory devices 316-1, . . . , 316-N can include a multi-chip device. A multi-chip device can include a number of different memory types and/or memory modules. For example, a memory system can include non-volatile or volatile memory on any type of a module.

As illustrated in FIG. 3, the apparatus 304 can include a computing device (e.g., computing core). In some embodiments, the apparatus 304 can be an FPGA. As illustrated in FIG. 3, the plurality of computing devices 310 can include ports 311 that can each be coupled to the plurality of communication subsystems 306 (as an example, without being coupled via an additional set of communication subsystems, such as communication subsystems 108 and 208, (which may be multiplexers) illustrated in FIGS. 1 and 2, respectively. The computing device 310 can be coupled to the plurality of communication subsystems 306 via corresponding port connections including a memory port ("MemPort") 311-1, system port "SystemPort") 311-2, peripheral port ("PeriphPort") 311-3, and front port ("FrontPort") 311-4).

The memory port 311-1 can be directly coupled to a communication subsystem 306-1 specifically designated to receive data from a memory port and transfer the data to a memory controller 312. The system port 311-2 can be directly coupled to a communication subsystem 308 that is further coupled to a plurality of buffers 319-1, 319-2, 319-3 (hereinafter referred to collectively as buffers 319). Each of the plurality of buffers 319 can be coupled to a respective one of a plurality of communication subsystems 306-2, 306-3, 306-4. The plurality of communication subsystems 306-2, 306-3, 306-4 can be coupled to an additional plurality of buffers 317-1, 317-2, 317-3. The plurality of buffers 317 are each coupled to a respective one of a plurality of hardware accelerators 314-1, 314-2, 314-3. The plurality of hardware accelerators 314 are coupled to logic 313. The plurality of communication subsystems 306-2, 306-3, 306-4 are each specifically designated to receive data from the system port 311-2 and transfer the data to a respective accelerator (e.g., an on-chip accelerator) 314, which can then transfer data to additional logic circuitry 313.

The peripheral port 311-3 can be directly coupled to a communication subsystem 306-5 specifically designated to receive data from the peripheral port 311-3 and transfer the data to a serial port 318. The front port 311-4 can be directly coupled to a communication subsystem 306-6 specifically designated to receive data from the front port 311-4 and transfer the data to a host interface 320, and subsequently to a host 302 via channels 303 and/or 305. In this embodiment, the hardware accelerators 314 may be coupled to the computing device 310 via a multiplexer. In contrast, a multiplexer may not be used to couple the controller 312, the serial port 318, and/or the host interface 320 to the computing device 310, but rather the ports and the communication subsystem are directly connected for data transfer.

In some embodiments, the communication subsystems 306 can facilitate visibility between respective address spaces of the computing device 310. For example, the computing device 310 can, responsive to receipt of data and/or a file, store the data in a memory resource of the computing device 310. The computing device can associate an address (e.g., a physical address) corresponding to a location in the memory resource of the computing device 310 in which the data is stored. In addition, the computing device 310 can parse (e.g., break) the address associated with the data into logical blocks.

In some embodiments, the zeroth logical block associated with the data can be transferred to a processing device (e.g., a reduced instruction set computing (RISC) device). A particular computing device (e.g., computing device 110, 210, 310) can be configured to recognize that a particular set of logical addresses are accessible to that computing device (e.g., 210-2), while other computing devices (e.g., computing device 210-3, 210-4, respectively, etc.) can be configured to recognize that different sets of logical addresses are accessible to those computing devices 110, 210, 310. Stated alternatively, a first computing device (e.g., the computing device 210-2) can have access to a first set of logical addresses associated with that computing device (210-2), and a second computing device (e.g., the computing device 210-3) can have access to a second set of logical address associated therewith, etc.

If data corresponding to the second set of logical addresses (e.g., the logical addresses accessible by the second computing device 210-3) is requested at the first computing device (e.g., the computing device 210-2), the communication subsystems 306 can facilitate communication between the first computing device (e.g., the computing device 210-2) and the second computing device (e.g., the computing device 210-3) to allow the first computing device (e.g., the computing device 210-2) to access the data corresponding to the second set of logical addresses (e.g., the set of logical addresses accessible by the second computing device 210-3). That is, the communication subsystem 308 can facilitate communication between the computing device 310 (e.g., 210-1) and additional computing devices (e.g., computing devices 210-2, 210-3, 210-4) to allow address spaces of the computing devices to be visible to one another.

In some embodiments, communication between the computing devices 110, 210, 310 to facilitate address visibility can include receiving, by an event queue of the first computing device (e.g., the computing device 210-1), a message requesting access to the data corresponding to the second set of logical addresses, loading the requested data into a memory resource of the first computing device, and transferring the requested data to a message buffer. Once the data has been buffered by the message buffer, the data can be transferred to the second computing device (e.g., the computing device 210-2) via the communication subsystem 310.

For example, during performance of an extended memory operation, the controller 115, 215, 315 and/or a first computing device (e.g., the computing device 210-1) can determine that the address specified by a host command (e.g., a command to initiate performance of an extended memory operation generated by a host such as the host 102 illustrated in FIG. 1) corresponds to a location in a memory resource of a second computing device (e.g., the computing device 210-2) among the plurality of computing devices (110, 210). In this case, a computing device command can be generated and sent from the controller 115, 215, 315 and/or the first computing device (210-1) to the second computing device (210-2) to initiate performance of the extended memory operation using an operand stored in the memory resource of the second computing device (210-2) at the address specified by the computing device command.

In response to receipt of the computing device command, the second computing device (210-2) can perform the extended memory operation using the operand stored in the memory resource of the second computing device (210-2) at the address specified by the computing device command. This can reduce command traffic from between the host and the storage controller and/or the computing devices (210, 310), because the host need not generate additional commands to cause performance of the extended memory operation, which can increase overall performance of a computing system by, for example reducing a time associated with transfer of commands to and from the host.

In some embodiments, the controller 115, 215, 315 can determine that performing the extended memory operation can include performing multiple sub-operations. For example, an extended memory operation may be parsed or broken into two or more sub-operations that can be performed as part of performing the overall extended memory operation. In this case, the controller 115, 215, 315 and/or the communication subsystems (106, 108, 206, 208, 308) can utilize the above described address visibility to facilitate performance of the sub-operations by various computing devices 110, 210, 310. In response to completion of the sub-operation, the controller 115, 215, 315 can cause the results of the sub-operations to be coalesced into a single result that corresponds to a result of the extended memory operation.

In other embodiments, an application requesting data that is stored in the computing devices 110, 210, 310 can know (e.g., can be provided with information corresponding to) which computing devices 110, 210, 310 include the data requested. In this example, the application can request the data from the relevant computing device 110, 210, 310 and/or the address may be loaded into multiple computing devices 110, 210, 310 and accessed by the application requesting the data via the communication subsystems 108, 106, 208, 206, 308.

The controller 115, 215, 315 can be discrete circuitry that is physically separate from the communication subsystems 108, 106, 208, 206, 308 and can each be provided as one or more integrated circuits that allows communication between the computing devices 110, 210, 310, the memory controller 112, 212, 312 and/or the controller 115, 215, 315. Non-limiting examples of communication subsystems 108, 106, 208, 206, 308 can include a XBAR or other communications subsystem that allows for interconnection and/or interoperability of the controller 115, 215, 315, the computing devices 110, 210, 310, and/or the memory controller 112, 212, 312.

As described above, responsive to receipt of a command generated by the controller 115, 215, 315, the communication subsystems 108, 106, 208, 206, 308, and/or a host (e.g., the host 102 illustrated in FIG. 1), performance of extended memory operations using data stored in the computing devices 110, 210, 310 and/or from blocks of data streamed through the computing devices 110, 210, 310 can be realized.

Figure 4:
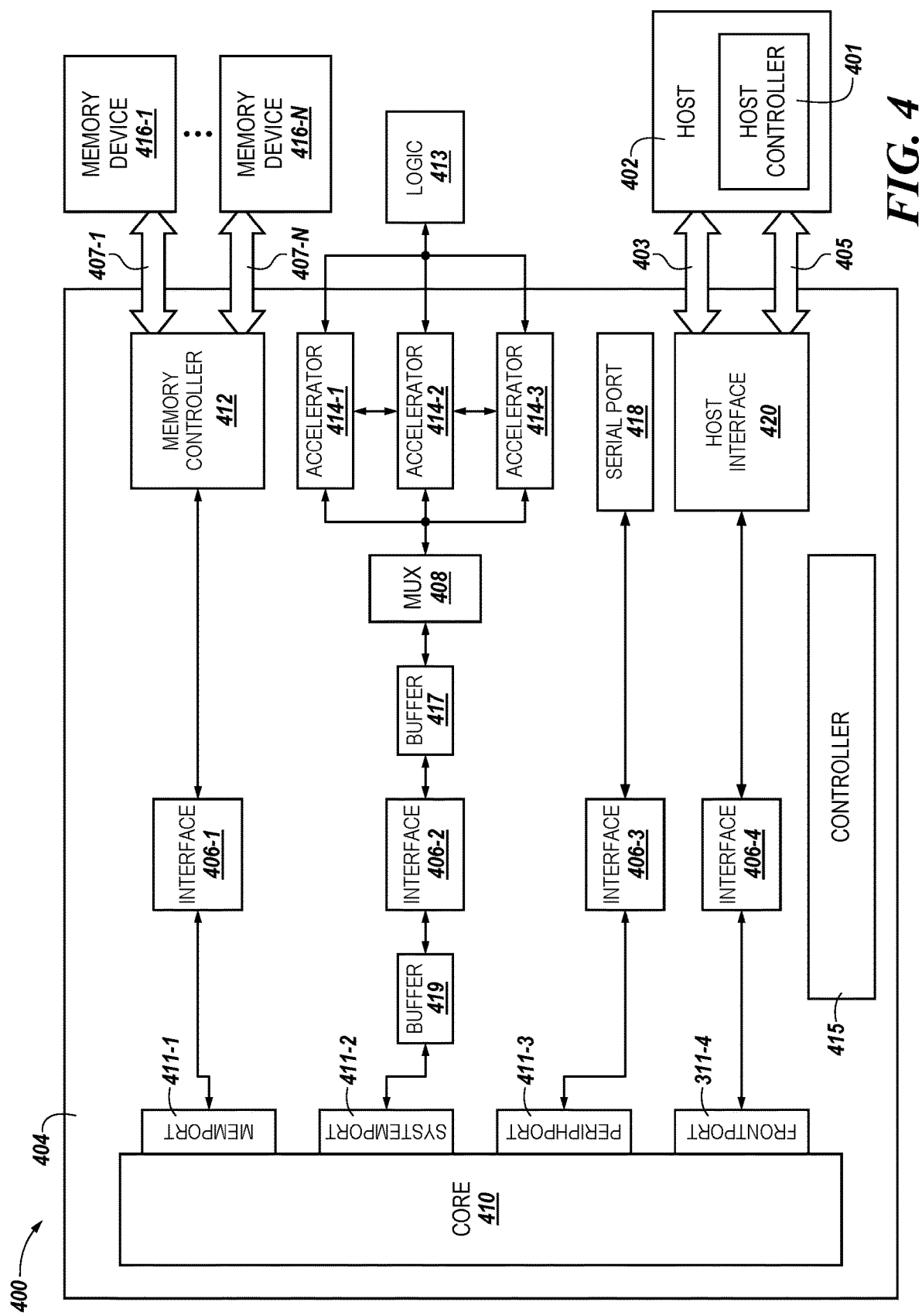
FIG. 4 is yet another functional block diagram in the form of a computing system including an apparatus including a first plurality of communication subsystems, a second plurality of communication subsystems, and a plurality of memory devices in accordance with a number of embodiments of the present disclosure.

FIG. 4 is a functional block diagram in the form of a computing system 400 including an apparatus 404 including a first plurality of communication subsystems 406, a second communication subsystem 408, and a plurality of memory devices 416 in accordance with a number of embodiments of the present disclosure.

As illustrated in FIG. 4, the apparatus 404 can include a computing device (e.g., computing core). In some embodiments, the apparatus 404 can be an FPGA. As illustrated in FIG. 4, and similarly in FIG. 3, the plurality of computing devices 410 can include ports 411 that can each be coupled to the plurality of communication subsystems 406 (as an example, without being coupled via an additional set of communication subsystems, such as communication subsystems 108 and 208, (which may be multiplexers) illustrated in FIGS. 1 and 2, respectively. The computing device 410 can be coupled to the plurality of communication subsystems 406 via corresponding port connections including a memory port ("MemPort") 411-1, system port "SystemPort") 411-2, peripheral port ("PeriphPort") 411-3, and front port ("FrontPort") 411-4).

The memory port 411-1 can be directly coupled to a communication subsystem 406-1 specifically designated to receive data from a memory port and transfer the data to a memory controller 412. In contrast to FIG. 3, FIG. 4 illustrates the system port 411-2 being directly coupled to a buffer 419 that is coupled directly to the second communication subsystem 406-2. The second communication subsystem 406-2 is likewise coupled to an additional buffer 417. The additional buffer 417 is coupled to an additional communication subsystem 408. As is shown similarly in FIG. 2, FIG. 4 illustrates a communication subsystem 408 that is coupled to each of a plurality of hardware accelerators 414-1, 414-2, 414-3, respectively.

Further, the peripheral port 411-3 can be directly coupled to a communication subsystem 406-5 specifically designated to receive data from the peripheral port 411-3 and transfer the data to a serial port 418. The front port 411-4 can be directly coupled to a communication subsystem 406-6 specifically designated to receive data from the front port 411-4 and transfer the data to a host interface 420, and subsequently to a host 402 via channels 403 and/or 405. In this embodiment, the hardware accelerators 414 may be coupled to the computing device 410 via a multiplexer. In contrast, a multiplexer may not be used to couple the controller 412, the serial port 418, and/or the host interface 420 to the computing device 310, but rather the ports and the communication subsystem are directly connected for data transfer.

FIG. 5 is a functional block diagram in the form of a computing core 510 including a number of ports 511-1, 511-2, 511-3, 511-4 in accordance with a number of embodiments of the present disclosure. The computing core 510 can include a memory management unit (MMU) 520, a physical memory protection (PMP) unit 522, and a cache 524.

The MMU 520 refers to a computer hardware component used for memory and caching operations associated with a processor. The MMU 520 can be responsible for memory management and be integrated into the processor, or, in some examples, can be on a separate integrated circuit (IC) chip. The MMU 520 can be used for hardware memory management which can include overseeing and regulating the processor's use of random access memory (RAM) and cache memory. The MMU 520 can be used for operating system (OS) memory management, which can ensure the availability of adequate memory resources for the objects and data structures of each running program. The MMU 520 can be used for application memory management, which can allocate each individual program's required or used memory, and then recycle freed up memory space when the operation concludes or the space becomes available.

In one embodiment, the PMP unit 522 can be used to restrict access to memory and isolate processes from each other. The PMP unit 522 can be used to set memory access privileges (read, write, execute) for specified memory regions. The PMP unit 522 can support 8 regions with a minimum region size of 4 bytes. In some examples, the PMP unit 522 may only be programmed in M-mode. The PMP unit 522 may enforce permissions on U-mode accesses. However, locked regions may additionally enforce their permissions on M-mode. The cache 524 can be an SRAM cache, a 3D cross-point cache, etc. The cache 524 can include 8 KB, 16 KB, 32 KB, etc. and can include error correction coding (ECC).

The computing core 510 can also include a plurality of ports including a memory port 511-1, a system port 511-2, a peripheral port 511-3, and a front port 511-4. The memory port 511-1 can be directly coupled to a communication subsystem (as illustrated in FIG. 3) specifically designated to receive data from a memory port 511-1. The system port 511-2 can be directly coupled to a communication subsystem specifically designated to receive data from the system port 511-2. The data through the system port 511-2 can be transferred to an accelerator (e.g., an on-chip accelerator). The peripheral port 511-3 can be directly coupled to a communication subsystem specifically designated to receive data from the peripheral port 511-3 and this data can be eventually transferred to a serial port. The front port 511-4 can be directly coupled to a communication subsystem specifically designated to receive data from the front port 511-4 and this data can be eventually transferred to a host interface, and subsequently to a host.

The computing core 510 can be a full-Linux capable, cache-coherent 64-bit RISC-V processor. In some examples, the memory port 511-1, the system port 511-2, and the peripheral port 511-3 can be outgoing ports and the front port 511-4 can be an incoming port. An example of computing core 510 can include a U54-MC computing core. The computing core 510 can include an instruction memory system, an instruction fetch unit, an execution pipeline unit, a data memory system, and support for global, software, and timer interrupts. The instruction memory system can include a 16 Kibibyte (KiB) 2-way set-associative instruction cache. The access latency of all blocks in the instruction memory system can be one clock cycle. The instruction cache may not be kept coherent with the rest of the platform memory system. Writes to the instruction memory may be synchronized with the instruction fetch stream by executing a FENCE.I instructions. The instruction cache can have a line size of 64 byes, and a cache line fill can trigger a burst access outside the computing core 510.

The instruction fetch unit can include branch prediction hardware to improve performance of the processor core. The branch predictor can include a 28-entry branch target buffer (BTB), which can predict a target of taken branches, a 512-entry branch history table (BHT), which can predict the direction of conditional branches, and a 6-entry returnaddress stack (RAS) which can predict a target of procedure returns. The branch predictor may have one-cycle latency, so that correctly predicted control-flow instructions result in no penalty. An incorrect prediction of control-flow instructions may incur three-cycle penalty.

The execution pipeline unit can be a single-issue, in-order pipeline. The pipeline can include five stages: instruction fetch, instruction decode and register fetch, execute, data memory access, and register writeback. The pipeline can have a peak execution rate of one instruction per clock cycle, and may be fully bypassed so that most instructions have a one-cycle result latency. The pipeline may interlock on read-after-write and write-after-write hazards, so instructions may be scheduled to avoid stalls.

The data memory system can include a DTIM interface, which can support up to 8 KiB. The access latency from a core to its own DTIM may be two clock cycles for full words and three clock cycles for smaller quantities. Memory requests from one core to any other core's DTIM may not be as performant as memory requests from a core to its own DTIM. Misaligned accesses are not supported in hardware and may result in a trap to allow software emulation.

In some embodiments, the computing core 510 can include a floating-point unit (FPU) which can provide full hardware support for the IEEE 754-2008 floating-point standard for 32-bit single-precision and 64-bit double-precision arithmetic. The FPU can include a fully pipelined fused-multiply-add unit and an iterative divide and square-root unit, magnitude comparators, and float-to-integer conversion units, with full hardware support for subnormals and IEEE default values.

Figure 6:
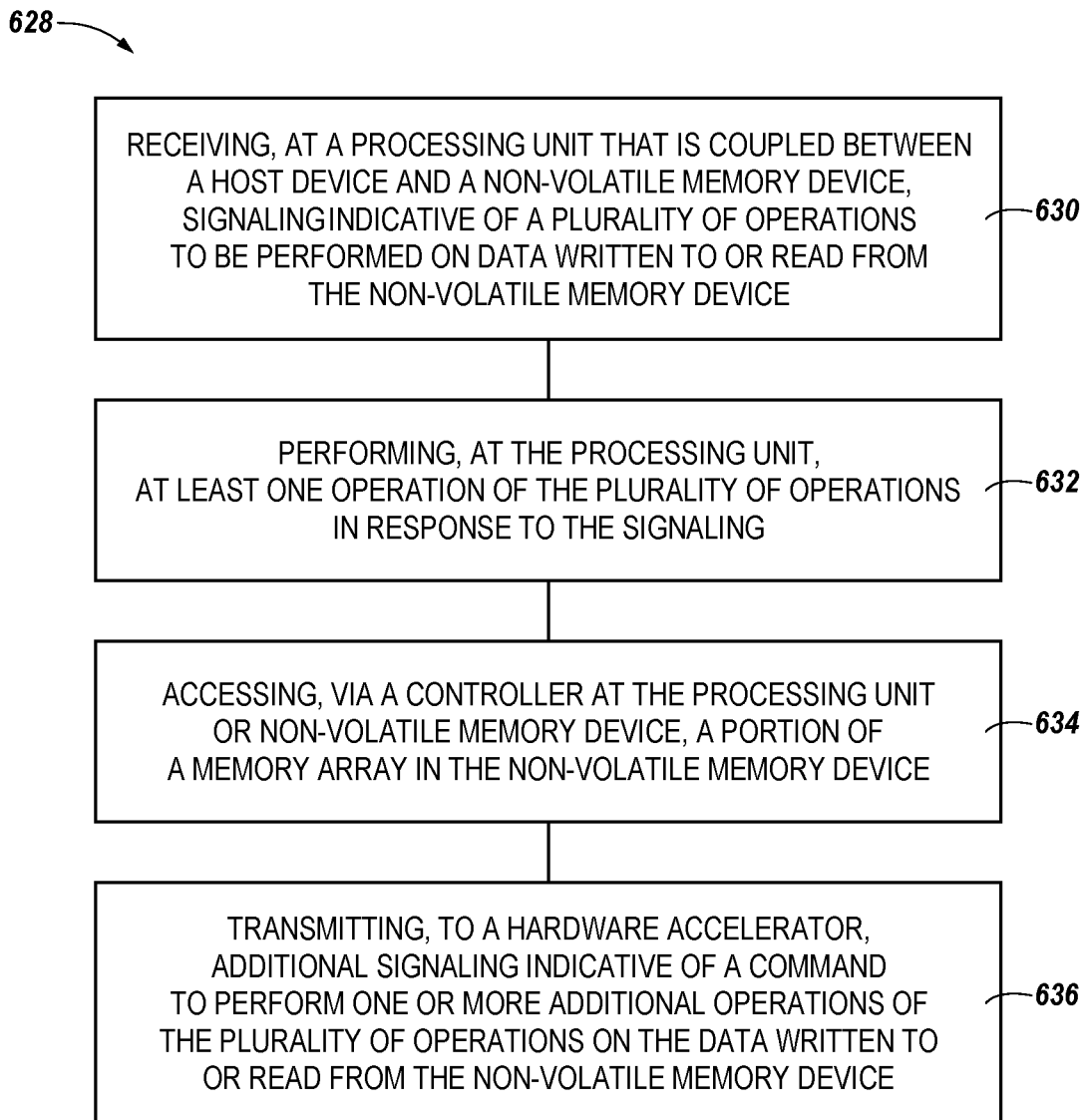
FIG. 6 is a flow diagram representing an example method corresponding to extended memory communication in accordance with a number of embodiments of the present disclosure.

FIG. 6 is a flow diagram representing an example method 628 corresponding to an extended memory interface in accordance with a number of embodiments of the present disclosure. At block 630, the method 628 can include receiving, at a processing unit that is coupled between a host device and a non-volatile memory device, signaling indicative of a plurality of operations to be performed on data written to or read from the non-volatile memory device. The quantity of operations can include extended memory operations as described above.

At block 632, the method 628 can include performing, at the processing unit, at least one operation of the plurality of operations in response to the signaling. A computing device (such as computing device 110, 210, 310, 410 in FIGS. 1-4, respectively) can include the processing unit that performs the at least one operation. The operation can be performed using a block of data in response to receipt of the block of data to reduce a size of data from a first size to a second size by the at least one of the plurality of computing devices. The performance of the operation can be caused by a controller. The controller can be analogous to the controller 115, 215, 315 illustrated in FIGS. 1-3, herein. In some embodiments, performing the operation can include performing an extended memory operation, as described herein. The operation can further include performing, by the particular computing device, the operation in the absence of receipt of a host command from a host coupleable to the controller. In response to completion of performance of the operation, the method 628 can include sending a notification to a host coupleable to the controller.

At block 634, the method 628 can include accessing, via a controller at the processing unit or non-volatile memory device, a portion of a memory array in the non-volatile memory device. The non-volatile memory device can be accessed by a memory controller and the memory controller can send the accessed data to a computing device, a hardware accelerator, etc. in order to perform one of the quantity of operations. The method 628 can further include causing, using an additional controller (e.g., memory controller), the blocks of data to be transferred from the memory device to a plurality of communication subsystems. The method 628 can further include allocating, via the pluralities of communication subsystems, resources corresponding to respective computing devices among the plurality of computing devices to perform the operation on the block of data.

At block 636, the method 628 can include transmitting, to a hardware accelerator, additional signaling indicative of a command to perform one or more additional operations of the plurality of operations on the data written to or read from the non-volatile memory device. For example, signaling indicative of a first operation can be sent to a first hardware accelerator, signaling indicative of a second operation can be sent to a second hardware accelerator, etc.

In some embodiments, the command to initiate performance of the operation can include an address corresponding to a location in the memory array of the particular computing device and the method 628 can include storing a result of the operation in the address corresponding to the location in the particular computing device. For example, the method 628 can include storing a result of the operation in the address corresponding to the memory location in the particular computing device in which the operand corresponding to performance of the operation was stored prior to performance of the extended memory operation. That is, in some embodiments, a result of the operation can be stored in the same address location of the computing device in which the data that was used as an operand for the operation was stored prior to performance of the operation.

In some embodiments, the method 628 can include determining, by the controller, that the operand corresponding to performance of the operation is not stored by the particular computing device. In response to such a determination, the method 628 can further include determining, by the controller, that the operand corresponding to performance of the operation is stored in a memory device coupled to the plurality of computing devices. The method 628 can further include retrieving the operand corresponding to performance of the operation from the memory device, causing the operand corresponding to performance of the operation to be stored in at least one computing device among the plurality of computing device, and/or causing performance of the operation using the at least one computing device. The memory device can be analogous to the memory devices 116 illustrated in FIG. 1.

The method 628 can, in some embodiments, further include determining that at least one sub-operation is to be performed as part of the operation, sending a command to a computing device different than the particular computing device to cause performance of the sub-operation, and/or performing, using the computing device different than the particular computing device, the sub-operation as part of performance of the operation. For example, in some embodiments, a determination that the operation is to be broken into multiple sub-operations can be made and the controller can cause different computing devices to perform different sub-operations as part of performing the operation. In some embodiments, the controller can, in concert with the first and the second pluralities of communications subsystem, such as 108, 106, 208, 206, 308, 306, and 408, 406 illustrated in FIGS. 1-4, herein, assign sub-operations to two or more of the computing devices as part of performance of the operation and/or to two or more of the hardware accelerators.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, at a processing unit that is coupled between a host device and a non-volatile memory device, signaling indicative of at least one of a plurality of operations to be performed on data written to or read from the non-volatile memory device;
   performing, at the processing unit, the at least one operation of the plurality of operations in response to the signaling; and
   transmitting, to a logic device external to the processing unit, additional signaling indicative of a command to perform one or more additional operations of the plurality of operations on the data written to or read from the non-volatile memory device, wherein the transmitted additional signaling is indicative of a first portion of the command to perform the one or more additional operations by the logic device.

2. The method of claim 1, further comprising, in response to receiving the signaling, accessing, via a controller at the processing unit, a portion of a memory array in the non-volatile memory device.

3. The method of claim 1, wherein accessing the portion of the non-volatile memory device comprises accessing an array of phase change memory cells or cells of a resistive random access memory (ReRAM), or both.

4. The method of claim 1, wherein performing the at least one of the plurality of operations further comprises performing an operation in which data is ordered, reordered, removed, or discarded, or a comma-separated value parsing operation, or any combination thereof.

5. The method of claim 1, wherein transmitting to the logic device comprises transmitting to a hardware accelerator.

6. The method of claim 5, further comprising transmitting further additional signaling indicative of a second portion of the command to perform the one or more additional operations by an additional hardware accelerator.

7. A method, comprising:
   receiving, from a computing device and at a logic device external to the computing device, signaling indicative of a first portion of a command to perform a portion of an operation on data written to or read from a non-volatile memory device, wherein the signaling indicates the operation to be executed by the logic device; and
   performing the operation on the data by the logic device.

8. The method of claim 7, wherein the signaling further indicates a location in the non-volatile memory device.

9. The method of claim 7, further comprising accessing the data in a particular location in the non-volatile memory device.

10. The method of claim 7, wherein the signaling indicative of the operation comprises signaling associated with reducing a size of data from a first size to a second size by the computing device.

11. The method of claim 7, further comprising sending additional signaling indicative of performing a second portion of the command to perform a second portion of the operation from the hardware accelerator to an additional hardware accelerator.

12. The method of claim 11, further comprising:
    performing the second portion of the command to perform the second portion of the operation in the additional hardware accelerator; and
    performing a third portion of the command to perform a third portion of the operation in the hardware accelerator.

13. The method of claim 12, further comprising combining a result of the performed second portion of the operation and a result of the performed third portion of the operation.

14. An apparatus, comprising:
    a computing device comprising:
        a processing unit configured to perform an operation on a block of data; and
        a memory array configured as a cache for the processing unit;
    a hardware accelerator coupled to the computing device;
    wherein the computing device is to:
        receive, at the processing unit that is coupled between a host device and the memory device, signaling indicative of a first portion of a command to perform a portion of an operation to be performed on data written to or read from the memory device; and
        transmit to the hardware accelerator, additional signaling indicative of a command to perform at least a portion of the operation.

15. The apparatus of claim 14, further comprising a communication subsystem, wherein the computing device is coupled to the memory device via the communication subsystem.

16. The apparatus of claim 14, further comprising a communication subsystem, wherein the communication subsystem is coupled to the hardware accelerator and the additional signaling is transmitted to the hardware accelerator via the communication subsystem.

17. The apparatus of claim 14, wherein the memory device comprises at least one of a double data rate (DDR) memory, a three-dimensional (3D) cross-point memory, or a NAND memory, or any combination thereof.

18. The apparatus of claim 14, wherein the computing device is a reduced instruction set computer (RISC)-V.

19. The apparatus of claim 14, wherein the processing unit of the computing device is configured with a reduced instruction set architecture.

\* \* \* \* \*